US011487475B2

(12) United States Patent
Lin

(10) Patent No.: US 11,487,475 B2
(45) Date of Patent: Nov. 1, 2022

(54) CONTROL METHOD FOR REFERRING TO EXPIRED BLOCK TABLE TO PERFORM EXPIRED BLOCK RECYCLING OPERATION AND ASSOCIATED FLASH MEMORY CONTROLLER AND MEMORY DEVICE

(71) Applicant: Silicon Motion, Inc., Hsinchu County (TW)

(72) Inventor: Ching-Hui Lin, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 12 days.

(21) Appl. No.: 17/183,355

(22) Filed: Feb. 24, 2021

(65) Prior Publication Data

US 2022/0004339 A1 Jan. 6, 2022

(30) Foreign Application Priority Data

Jul. 6, 2020 (TW) ................................ 109122716

(51) Int. Cl.
*G06F 3/06* (2006.01)
*G06F 12/0804* (2016.01)
*G11C 16/04* (2006.01)
*G11C 16/10* (2006.01)

(52) U.S. Cl.
CPC .......... *G06F 3/0659* (2013.01); *G06F 3/0604* (2013.01); *G06F 3/064* (2013.01); *G06F 3/0652* (2013.01); *G06F 3/0656* (2013.01); *G06F 3/0679* (2013.01); *G06F 12/0804* (2013.01); *G11C 16/0483* (2013.01); *G11C 16/10* (2013.01); *G06F 2212/1032* (2013.01)

(58) Field of Classification Search
None
See application file for complete search history.

(56) References Cited

U.S. PATENT DOCUMENTS 9,069,474 B2 6/2015 Venkata
10,102,118 B2 10/2018 Kanno
2012/0198130 A1* 8/2012 Noborikawa ....... G06F 12/0246 711/E12.103
2017/0123700 A1 5/2017 Sinha
2017/0315867 A1* 11/2017 Yang ..................... G06F 3/0688
2017/0329525 A1* 11/2017 Simonson .............. G06F 12/00
2020/0117361 A1 4/2020 Cheng

FOREIGN PATENT DOCUMENTS

CN 107783725 A * 3/2018 ............... G06F 3/06
TW 201947402 A 12/2019

* cited by examiner

*Primary Examiner* — Sanjiv Shah
*Assistant Examiner* — Elias Young Kim
(74) *Attorney, Agent, or Firm* — Winston Hsu

(57) ABSTRACT

A control method is applied to a flash memory controller, which includes the following steps: creating a write time table, wherein the write time table records block numbers of blocks having data stored therein and corresponding first time and second time; referring to the write time table to determine whether there is at least one first block in the flash memory module whose first time is earlier than a first threshold, and if so, recording the at least one first block into an expired block table; referring to the write time table to determine whether there is at least one second block in the flash memory module whose second time is earlier than a second threshold, and if so, recording the at least one second block into the expired block table; and referring to the expired block table to perform an expired block recycling operation.

20 Claims, 8 Drawing Sheets

500

| Block number | Time information of first page | Time information of intermediate page |
|---|---|---|
| B1 | T1_1 | T1_M |
| B2 | T2_1 | T2_M |
| ..... | ..... | ..... |

FIG. 5

CONTROL METHOD FOR REFERRING TO EXPIRED BLOCK TABLE TO PERFORM EXPIRED BLOCK RECYCLING OPERATION AND ASSOCIATED FLASH MEMORY CONTROLLER AND MEMORY DEVICE

BACKGROUND OF THE INVENTION

1. Field of the Invention

The present invention relates to a flash memory, and more particularly, to a flash memory controller and an associated control method.

2. Description of the Prior Art

With development of three-dimensional (3D) flash memory technology, more layers are stacked in a flash memory chip. In addition, nowadays, a flash memory module includes Triple-Level Cell (TLC) blocks or Quad-Level Cell (QLC) blocks. Therefore, quality of data stored in the flash memory is getting worse, and even the quality of data declines rapidly in only a few weeks after the data is written, causing the data difficult to be decoded or even unreadable. To solve this problem, the flash memory controller can use idle time to read a part of a content of each block in the flash memory module to determine the quality of each block. However, the above method costs a lot of time. Further, when the flash memory controller is often busy, the flash memory controller is not able to balance the access efficiency and the quality of blocks.

SUMMARY OF THE INVENTION

One of the objectives of the present invention is to provide a flash memory control and an associated method for efficiently pre-processing those blocks in the flash memory module that may have quality problems, to solve the aforementioned problem.

At least one embodiment of the present invention provides a control method applied to a flash memory controller. The flash memory controller is configured to access a flash memory module. The flash memory module is a three-dimensional (3D) NAND-type flash module. The flash memory module includes a plurality of flash memory chips. Each flash memory chip includes a plurality of blocks. Each block includes a plurality of pages. Each block includes a plurality of floating gate transistors controlled by multiple word lines and multiple bit lines which are located on different planes. The floating gate transistors on each word line form at least one page of the plurality of pages. The control method includes: when a data is written to a first page of any block of the flash memory module, recording a first time into the first page; when the data is written to at least one intermediate page of any block of the flash memory module, recording a second time into said at least one intermediate page; when the data is written to a last page of any block of the flash memory module, recording the first time and the second time into the last page; creating a write time table, wherein the write time table records block numbers of blocks having the data stored therein and the corresponding first time, or records block numbers of blocks having the data stored therein and the corresponding first time and second time; referring to the write time table to determine whether there is at least one block in the flash memory module that has the first time earlier than a first threshold, and if the flash memory module has at least one first block with the first time earlier than a first threshold, recording said at least one first block into an expired block table; referring to the write time table to determine whether there is at least one block in the flash memory module that has the second time earlier than a second threshold, and if the flash memory module has at least one second block with the second time earlier than a second threshold, recording said at least one second block into the expired block table; and according to said at least one first block and said at least one second block recorded into the expired block table performing an expired block recycling operation, to move a valid data in said at least one first block and said at least one second block to at least one blank block in sequence.

At least one embodiment of the present invention provides a flash memory controller. The flash memory controller is configured to access a flash memory module. The flash memory module is a 3D NAND-type flash module. The flash memory module includes a plurality of flash memory chips. Each flash memory chip includes a plurality of blocks. Each block includes a plurality of pages. Each block includes a plurality of floating gate transistors controlled by multiple word lines and multiple bit lines which are located on different planes. The floating gate transistors on each word line form at least one page of the plurality of pages. The flash memory controller includes a read only memory, a microprocessor and a buffer memory. The read only memory is configured to store a code. The microprocessor is configured to execute the code for controlling access of the flash memory module. When the microprocessor writes a data to a first page of any block of the flash memory module, a first time is recorded into the first page. When the microprocessor writes the data to at least one intermediate page of any block of the flash memory module, a second time is recorded into said at least one intermediate page. When the microprocessor writes the data to a last page of any block of the flash memory module, the first time and the second time are recorded into the last page. The microprocessor further creates a write time table, wherein the write time table records block numbers of blocks having the data stored therein and the corresponding first time, or records block numbers of blocks having the data stored therein and the corresponding first time and second time. The microprocessor refers to the write time table to determine whether there is any block in the flash memory module that has the first time earlier than a first threshold, and if the flash memory module has at least one first block with the first time earlier than a first threshold, said at least one first block is recorded into an expired block table. The microprocessor refers to the write time table to determine whether there is any block in the flash memory module that has the second time earlier than a second threshold, and if the flash memory module has at least one second block with the second time earlier than a second threshold, said at least one second block is recorded into the expired block table. And the microprocessor performs an expired block recycling operation according to said at least one first block and said at least one second block recorded into the expired block table, to move a valid data in said at least one first block and said at least one second block to at least one blank block in sequence.

At least one embodiment of the present invention provides a memory device including a flash memory module and a flash memory controller. The flash memory module is a 3D NAND-type flash module. The flash memory module includes a plurality of flash memory chips. Each flash memory chip includes a plurality of blocks. Each block includes a plurality of pages. Each block includes a plurality of floating gate transistors controlled by multiple word lines and multiple bit lines which are located on different planes. The floating gate transistors on each word line form at least one page of the plurality of pages. The flash memory controller is configured to access the flash memory module. When the flash memory controller writes a data to a first page of any block of the flash memory module, a first time is recorded into the first page. When the flash memory controller writes the data to at least one intermediate page of any block of the flash memory module, a second time is recorded into said at least one intermediate page. When the flash memory controller writes the data to a last page of any block of the flash memory module, the first time and the second time are recorded into the last page. The flash memory controller further creates a write time table, wherein the write time table records block numbers of blocks having the data stored therein and the corresponding first time, or records block numbers of blocks having the data stored therein and the corresponding first time and second time. The flash memory controller refers to the write timetable to determine whether there is any block in the flash memory module that has the first time earlier than a first threshold, and if the flash memory module has at least one first block with the first time earlier than a first threshold, said at least one first block is recorded into an expired block table. The flash memory controller refers to the write time table to determine whether there is any block in the flash memory module that has the second time earlier than a second threshold, and if the flash memory module has at least one second block with the second time earlier than a second threshold, said at least one second block is recorded into the expired block table. And the flash memory controller performs an expired block recycling operation according to said at least one first block and said at least one second block recorded into the expired block table, to move a valid data in said at least one first block and said at least one second block to at least one blank block in sequence.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram illustrating the write time table according to an embodiment of the present invention.

DETAILED DESCRIPTION

Figure 1:
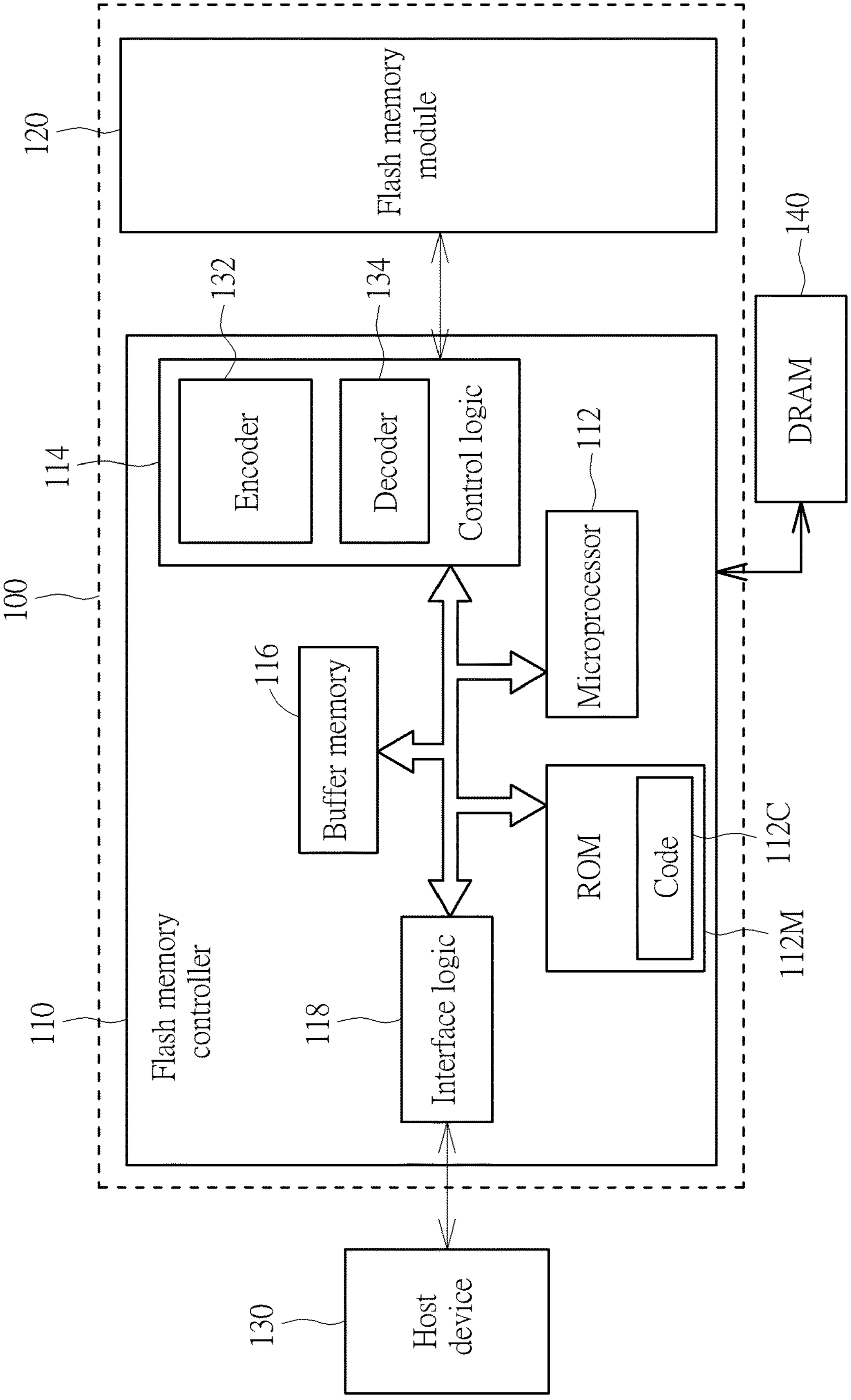
FIG. 1 is a diagram illustrating a memory device according to an embodiment of the present invention.

FIG. 1 is a diagram illustrating a memory device 100 according to an embodiment of the present invention. The memory device 100 includes a flash memory module 120 and a flash memory controller 110. The flash memory controller 110 is configured to access the flash memory module 120. According to the present embodiment, the flash memory controller 110 includes a microprocessor 112, a read only memory (ROM) 112M, a control logic 114, a buffer memory 116 and an interface logic 118. The read only memory 112M is configured to store a code 112C, and the microprocessor 112 is configured to execute the code 112C to control access of the flash memory module 120. The control logic 114 includes an encoder 132 and a decoder 134, wherein the encoder 132 is configured to encode data which is written in the flash memory module 120 to generate a corresponding check code (also known as an error correction code (ECC)), and the decoder 134 is configured to decode data read from the flash memory module 120.

In a general situation, the flash memory module 120 includes a plurality of flash memory chips, and each flash memory chip includes a plurality of blocks. The flash memory controller 110 performs a block-based erase operation upon the flash memory module 120. In addition, a block can record a specific number of pages, wherein the flash memory controller 110 performs a page-based write operation upon the flash memory module 120. In the present embodiment, the flash memory module 120 is a 3D NAND-type flash memory module.

In practice, through the microprocessor 112 executing the code 112C, the flash memory controller 110 may use its own internal components to perform many control operations. For example, the flash memory controller 110 uses the control logic 114 to control access of the flash memory module 120 (especially access of at least one block or at least one page), uses the buffer memory 116 to perform a required buffering operation, and uses the interface logic 118 to communicate with a host device 130. The buffer memory 116 is implemented by a random access memory (RAM). For example, the buffer memory 116 may be a static RAM (SRAM), but the present invention is not limited thereto. In addition, the flash memory controller 110 is coupled to a dynamic random access memory (DRAM) 140.

In one embodiment, the memory device 100 may be a portable memory device such as a memory card which conforms to one of the SD/MMC, CF, MS and XD specifications, and the host device 130 is another electronic device able to be connected to the memory device 100, such as a cellphone, a laptop, a desktop computer, etc. In another embodiment, the memory device 100 may be a solid state drive (SSD) or an embedded memory device which conforms to the universal flash storage (UFS) specification or embedded Multi Media Card (EMMC) specification, and can be arranged in a cellphone, a laptop or a desktop computer. At this time, the host device 130 can be a processor of the cellphone, a processor of the laptop or a processor of the desktop computer.

Figure 2:
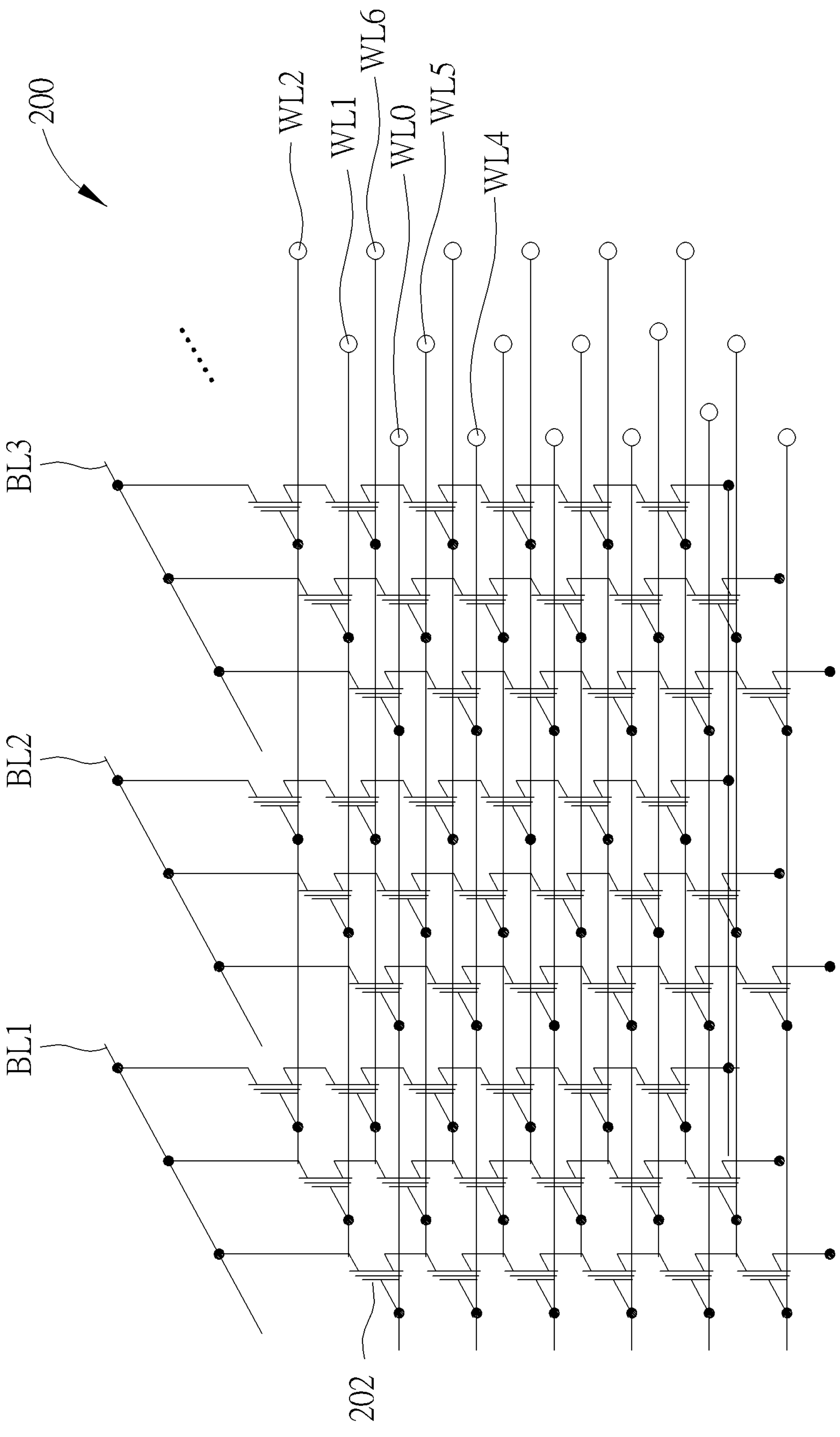
FIG. 2 is a diagram illustrating a block of a flash memory module according to an embodiment of the present invention.

FIG. 2 is a diagram illustrating a block 200 of the flash memory module 120 according to an embodiment of the present invention, wherein the flash memory module 120 is a 3D NAND-type flash memory module. As shown in FIG. 2, the block 200 includes a plurality of memory cells, such as floating gate transistors 202 shown in FIG. 2 or other charge trapping components. A 3D NAND-type flash memory structure is formed through a plurality of bit lines (only BL1-BL3 are shown in FIG. 2) and a plurality of word lines (e.g., WL0-WL2 and WL4-WL6 shown in FIG. 2). Taking a top plane in FIG. 2 as an example, all floating gate transistors on the word line WL0 form at least one page, all floating gate transistors on the word line WL1 form at least another one page, and so on. In addition, the definition between the word line WL0 and the page (logic page) may vary depending on a writing method of the flash memory. In detail, when data are stored using a Single-Level cell (SLC) means, all floating gate transistors on the word line WL0 correspond to only one logic page; when data are stored using a Multi-Level cell (MLC) means, all floating gate transistors on the word line WL0 correspond to two logic pages; when data are stored using a Triple-Level cell (TLC) means, all floating gate transistors on the word line WL0 correspond to three logic pages; and when data are stored using a Quad-Level cell (QLC) means, all floating gate transistors on the word line WL0 correspond to four logic pages. The 3D NAND-type flash memory structure and the relationship between word lines and pages are obvious to those skilled in the art. For simplification, no further illustration is provided.

Figure 3:
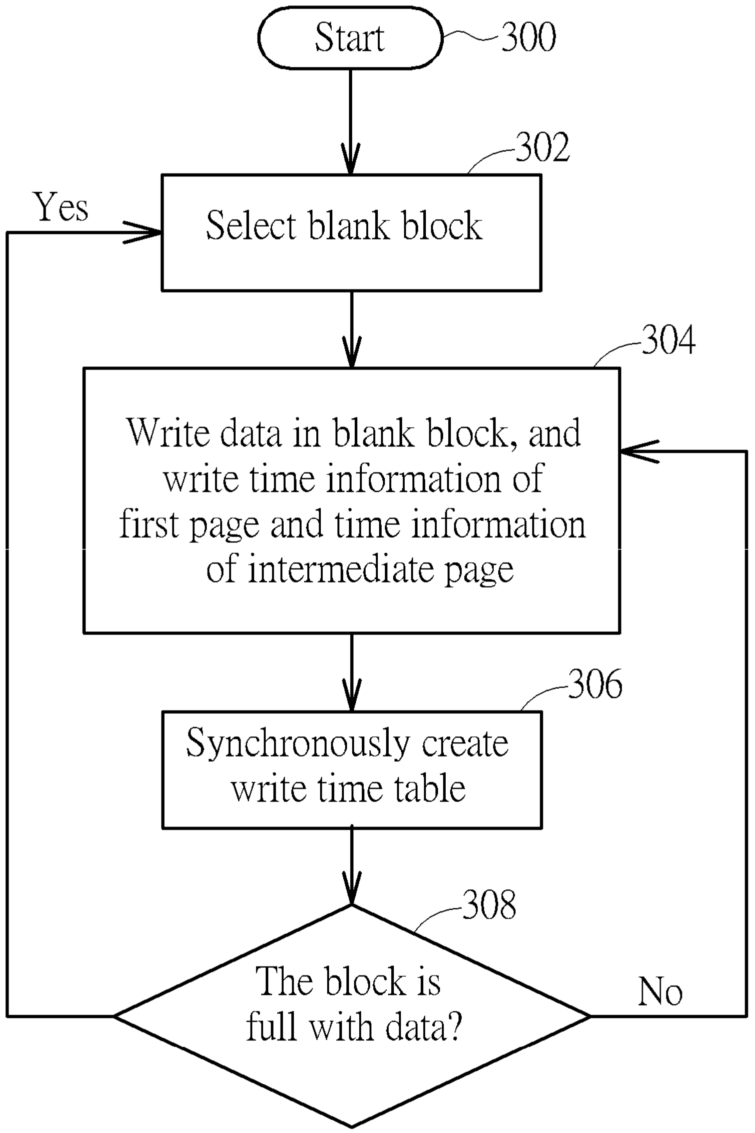
FIG. 3 is a flowchart illustrating creation of a write time table is created according to an embodiment of the present invention.

FIG. 3 is a flowchart illustrating creation of a write time table according to an embodiment of the present invention. In Step 300, the flow starts, and the flash memory controller 110 is powered on and performs an initialization operation. In step 302, the flash memory controller 110 selects a block from a plurality of blank blocks in the flash memory module 120, and prepares to write data from the host device 130 into the block. In step 304, the flash memory controller 110 starts writing data from a first page of the block, and writes current time information into a spare area when the data is written into the first page and an intermediate page. In practice, referring to the diagram of the flash memory module 120 shown in FIG. 4 and assuming a block B1 includes a plurality of pages P1-P256, the flash memory controller 110 writes data from host device 130 into the first page of the block B1 in sequence, wherein when the flash memory controller 110 is ready to write data to the page P1, the flash memory controller 110 simultaneously obtains a current time information T11, for example, set by an internal timer or an absolute time from the host device 130 (for example, 2 pm on May 11, 2020) to generate the corresponding time information, and write the data from the host device 130 and the related time information T1_1 into the page P1, wherein the time information T1_1 can be written in the spare area located on a back end of the page P1. Then, the flash memory controller 110 sequentially writes the data to the pages P2, P3, . . . , till the flash memory controller 110 is ready to write the data to the intermediate page P128, and the flash memory controller 110 simultaneously obtains a current time information T1_M and further writes the data from the host device 130 and the related time information T1_M into the page P128, wherein the time information T1_M can be written into the spare area at a back end of the page P128. It should be noticed that the pages P2 to P127 between the first page P1 and the intermediate page P128 may not require writing of any time information, so as to reduce burden of the flash memory controller 110. It should be noticed that the above-mentioned spare area of the page can also be called a management area that is used to store some management data, such as logical addresses.

Figure 4:
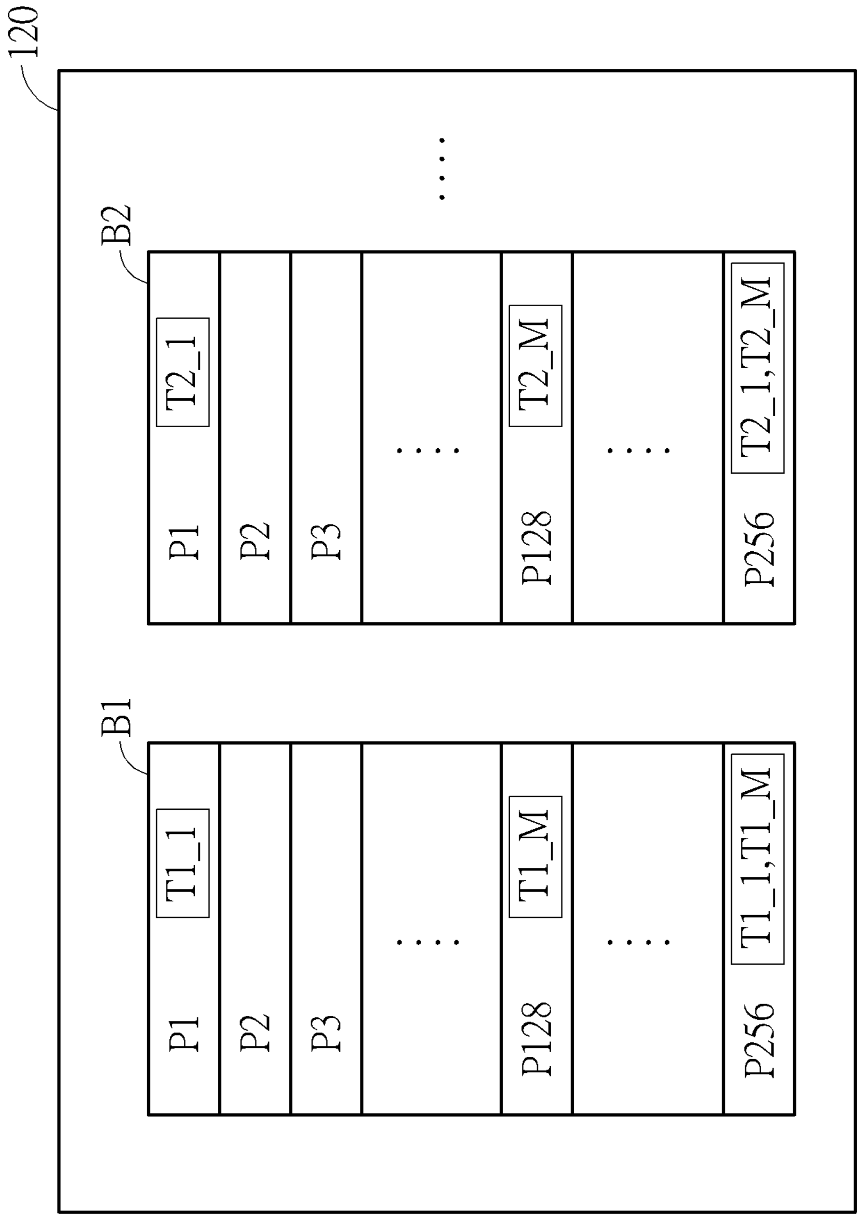
FIG. 4 is a diagram illustrating time information being written in a block.

It should be noticed that, in the embodiment of FIG. 4, the page P128 being used as the intermediate page is for illustrative purposes only, and the present invention is not limited thereto. In another embodiment, the page P127 can also be used as the intermediate page, or the pages P127 and P128 can be used as the intermediate pages at the same time. In addition, in another embodiment, a plurality of pages may be used as intermediate pages. For example, the four pages P126, P127, P128 and P129 are all used as the multiple intermediate pages described in this embodiment. That is, the spare areas of the pages P126, P127, P128 and P129 all store the corresponding time information.

Furthermore, the flash memory controller 110 sequentially writes data to the pages P129, P130, . . . , till the flash memory controller 110 is ready to write the data to the last page (e.g., a page P256), the flash memory controller 110 writes the time information T1_1 of the previous page P1 and the time information T1_M of the page P128 into the page P256 together with the data from the host device 130. The time information T1_M can be written to the spare area located at a back end of the page P256.

In step 306, in the process of writing data in the block Bl, the flash memory controller 110 will synchronously create a write time table 500 as shown in FIG. 5 in a DRAM 140, that is, the write time table 500 records the block B1 and the corresponding time information T1_1 and T1_M. It should be noticed that what is written in the write time table 500 is the time information T1_1 of the first page P1 and the time information T1_M. of the intermediate page (e.g., the page P128), and if there are multiple intermediate pages (e.g., four pages P126, P127, P128 and P129 used as the intermediate pages at the same time) set in each block as described in the previous paragraph, the write time table 500 can generate a single time information of the intermediate page according to the multiple time information recorded by the pages P126, P127, P128 and P129. For example, the single time information corresponding to the intermediate page may be obtained by averaging the multiple time information recorded in the pages P126, P127, P128 and P129 or selecting a median value from the multiple time information recorded in the pages P126, P127, P128 and P129.

It should be noticed that regarding some memory devices which do not have the DRAM 140, the above-mentioned write time table 500 may be stored in the buffer memory 116.

In step 308, the microprocessor 112 determines whether all pages of the block B1 are full with data. If No, the flow proceeds with step 304 to continue writing data to the remaining pages of the block B1; if Yes, the flow proceeds with step 302 to select a next blank block, such as a block B2 shown in FIG. 4. Then, similar to the data writing process of the flash memory controller 110 writing data to the block B1, when the flash memory controller 110 is ready to write data to the page P1 of block B2, the flash memory controller 110 simultaneously obtains the current time information T2_1, and writes both of the data from the host device 130 and the related time information T2_1 to the page P1 of the block B2; when the flash memory controller 110 is ready to write data to the page P128 of block B2, the flash memory controller 110 simultaneously obtains the current time information T2_M, and writes both of the data from the host device 130 and the related time information T2_M to the page P128 of the block B2; and when the flash memory controller 110 is ready to write data to the page P256, the flash memory controller 110 writes all of the previous time information T2_1 of the page P1, the time information T2_M of the page P128 and the data from the host device 130 to the page P256. In addition, the microprocessor 112 updates the write time table 500 to record the block number B2 and the corresponding time information T2_1 and T2_M.

Whenever there is a blank block in the flash memory module 120 that starts storing data, the microprocessor 112 updates the write time table 500, that is, the write time table 500 records the time information of the first page P1 and the time information of the intermediate page (e.g., the page P128) of each block of the flash memory module 120.

In addition, the write time table 500 stays resident in the DRAM 140 to facilitate the expired block judgment operation and the garbage collection operation. When the memory device 100 requires being powered off, the microprocessor 112 writes the write time table 500 to the flash memory module 120 in advance. The write time table 500 is not read from the flash memory module 120 and loaded into the DRAM 140 for subsequent use until the memory device 100 is powered on.

Figure 6:
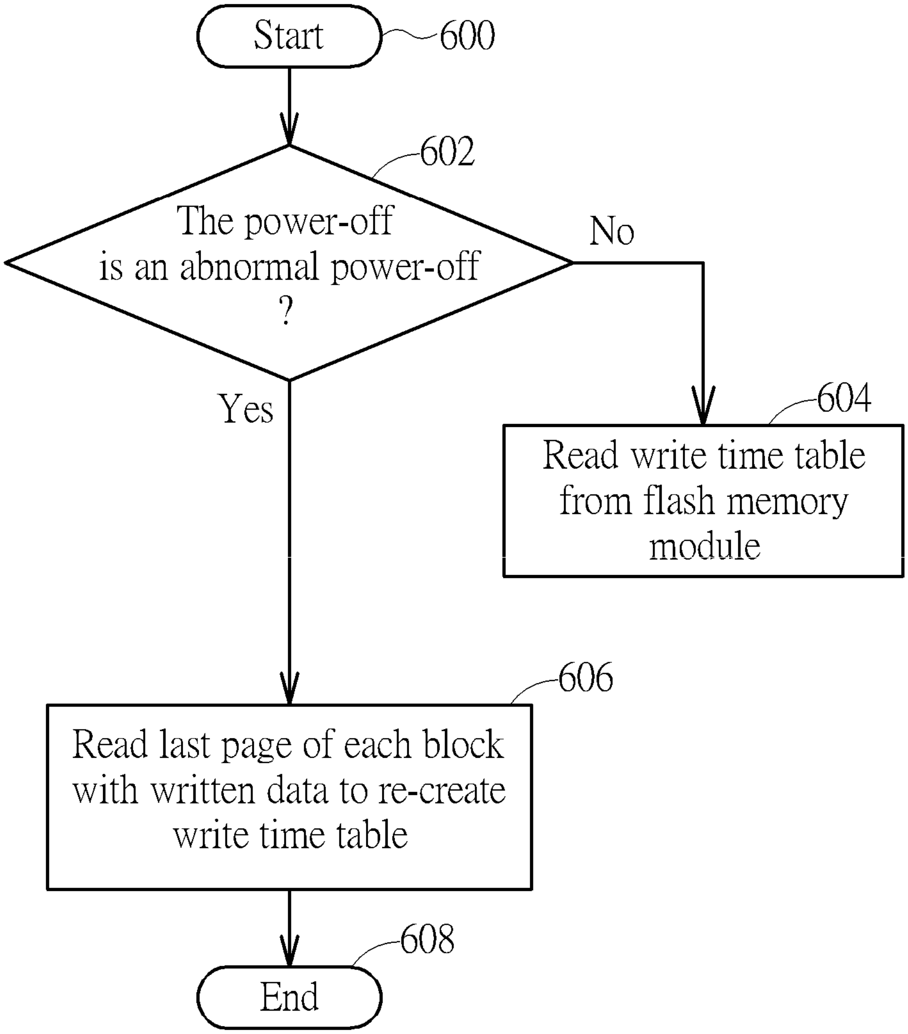
FIG. 6 is a flowchart illustrating the memory device being powered on and creating the write time table in DRAM according to an embodiment of the present invention.

However, the memory device 100 may be suddenly powered off because of various reasons, and the write time table 500 stored in the DRAM 140 may be lost. Therefore, after the memory device 100 is powered on again, the write time table 500 requires being re-created in the DRAM 140. Please refer to FIG. 6 illustrating the flowchart of creating the write time table 500 in the DRAM 140 after the memory device 100 is powered on according to an embodiment of the present invention. In step 600, the flow starts, and the memory device 100 is powered on and performs an initialization operation. In step 602, the microprocessor 112 determines whether power-off of the memory device 100 before power-on is an abnormal power-off (sudden power-off). If No, the flow proceeds with step 604 to read the write time table 500 from the flash memory module 120 and temporarily store the write time table 500 in the DRAM 140. If Yes, the flow proceeds with step 606. For example, when the memory device 100 is normally shut down/powered off, the flash memory controller 110 stores multiple temporary tables and data stored in the buffer memory 116 into the flash memory module 120, wherein the data includes a flag indicating whether the memory device 100 is normally shut down. Therefore, after the flash memory controller 110 is powered on, the above-mentioned flag stored in the flash memory module 120 can be read to determine whether the memory device 100 has experienced abnormal power-off before. For example, when the above-mentioned flag has not been set correctly, there has been an abnormal power-off before is determined. In step 606, the microprocessor 112 sequentially reads the last page (e.g., the page P256 shown in FIG. 4) of each block with written data in the flash memory module 120 to obtain the time information of the first page of the block and the time information of the intermediate page of the block. For example, referring to FIG. 4 at the same time, the microprocessor 112 can directly read the last page P256 of the block B1 to obtain the time information T1_1 of the first page P1 and the time information T1_M of the intermediate page P128, and may also directly read the last page P256 of the block B2 to obtain the time information T2_1 of the first page P1 and the time information T2_M of the intermediate page P128. In addition, in some special situations such as a situation where the data of the last page P256 of a block is damaged or a situation where the last page P256 of the block has not been written by any data, the microprocessor 112 can directly read the time information of the first page and the intermediate page of the above-mentioned block.

Since the initialization operation of the memory device 100 has a certain time limit, such as 1-2 seconds, and the flash memory controller 110 requires recreating many other comparison tables/mapping tables during the initialization operation, the present embodiment can obtain the time information of the first page and the time information of the intermediate page by only reading the last page of the block. In this way, the write time table 500 can be recreated very quickly to prevent the initialization operation from exceeding the time limit.

After obtaining the time information of the first page of each block with written data and the time information of the intermediate page of each block with written data, the write time table 500 can be re-created in the DRAM 140, and the flow proceeds with step 608 to end the operation.

Figure 7:
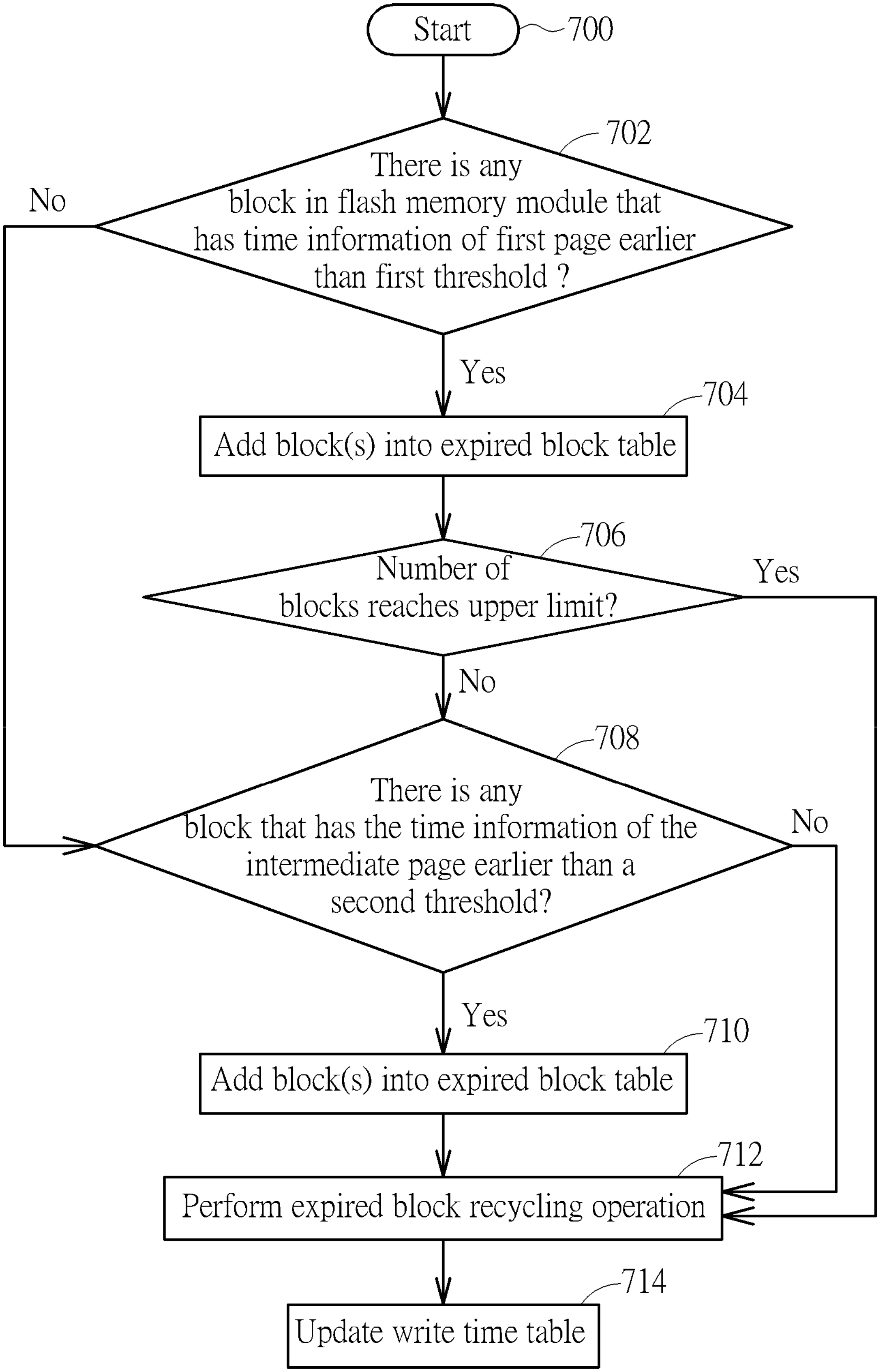
FIG. 7 is a flowchart illustrating an expired block recycling operation being performed according to an embodiment of the present invention.

FIG. 7 is a flowchart illustrating an expired block recycling operation being performed according to an embodiment of the present invention. In step 700, the flow starts, and the memory device 100 has completed the initialization operation. In step 702, the microprocessor 112 refers to the write time table 500 to determine whether there is any block in the flash memory module 120 that has the time information of the first page P1 earlier than a first threshold. If Yes, the flow proceeds with step 704. If No, the flow proceeds with step 708. The first threshold can be a time determined according to the current time. For example, if the current time is 8 pm on May 21, 2020, the first threshold can be 12 days ago, that is, the first threshold can be 8 pm on May 9, 2020.

Instep 704, the microprocessor 112 adds block (s) with the time information of the first page P1 earlier than the first threshold into an expired block table (for example, the expired block table records block numbers of these blocks), and marks these block(s) as block(s) to be processed. In the present embodiment, the expired block table is used to record the priority of the expired block recycling operation, and a size of the expired block table is fixed (that is, the number of blocks that can be recorded has an upper limit). Therefore, if the number of blocks determined in step 702 is too large, block(s) with earlier time information of the first page P1 are first selected to be added to the expired block table.

In step 706, the microprocessor 112 determines whether the number of the blocks recorded in the expired block table reaches the upper limit. If Yes, the flow proceeds with step 712. If No, the flow proceeds with step 708.

In step 708, the microprocessor 112 refers to the write time table 500 to determine whether there is any block in the flash memory module 120 that has the time information of the intermediate page (e.g., the page P128 in FIG. 4) earlier than a second threshold. If Yes, the flow proceeds with step 710. If No, the flow proceeds with step 712. The second threshold may be a time determined according to the current time, and the second threshold is later than the first threshold. For example, assuming that the current time is 8 pm on May 21, 2020, the second threshold can be 11 days ago, that is, the second threshold can be 8 pm on May 10, 2020.

In step 710, the microprocessor 112 adds block (s) with the time information of the intermediate page earlier than the second threshold into the expired block table, and marks these block (s) as the block (s) to be processed. In addition, if the number of blocks determined in step 708 is too large, block (s) with earlier time information of the intermediate page are first selected to be added to the expired block table.

Regarding the above steps 708 and 710, since blocks with the time information of the first page P1 earlier than the first threshold have been added to the expired block table in step 704, steps 708 and 710 may be regarded as adding blocks with the time information of the intermediate page between the second threshold and the first threshold to the expired block table.

It should be noticed that not all the blocks recorded in the above-mentioned expired block table are determined according to the method in steps 702 and 708, that is, some of the blocks recorded in the expired block table may be determined according to the block quality or other mechanisms.

In step 712, the microprocessor 112 sequentially performs the expired block recycling operation according to the blocks recorded in the above-mentioned expired block table. In practice, the microprocessor 112 can move valid data in the block recorded in the expired block table to a blank page, and mark the block as invalid or erase the block after the valid data of the block is completely moved. It should be noticed that the expired block recycling operation described in step 712 can be a background process. That is, when the flash memory controller 110 is in an idle state (for example, the flash memory controller 110 does not need to process an access command from the host device 130), the microprocessor 112 may start to perform the expired block recycling operation until the flash memory controller 110 receives an access command from the host device 130 and enters a busy state.

Since the density of the memory capacity of the 3D NAND flash memory is continuously increasing, performance of the 3D NAND flash memory is continuously degraded. Charges stored in a gate of a memory cell of a new type 3D NAND flash memory will be continually lost after the data is written. After a period of time, the charges stored in gates of some memory cells do not represent the charges of original data any more, such that errors often occur when the memory cells are read. These errors usually cause the flash memory controller to start some correction mechanisms such as changing the read voltage and hard decoding and soft decoding, such that correct data can be read from the expired blocks. These correction mechanisms are usually very time-consuming and power-consuming, and may not be able to correct the error at all, which makes the flash memory controller fail to read the correct data. Therefore, it is necessary to record a write time of the block to avoid the above-mentioned problems. It should be noticed that the expired block recycling operation described in the above embodiment is different from the garbage collection operation, and the expired block table in this embodiment is also different from the garbage collection sequence required for the garbage collection operation. In detail, during the operation of the memory device 100, the flash memory controller 110 continually determines the current number of valid pages in each block of the flash memory module 120, to further determine which block requires undergoing the garbage collected operation. For example, when a number of valid pages of a block is lower than a threshold, the block is listed into the garbage collection sequence for undergoing subsequent garbage collection operation. However, the expired block table described in this embodiment records blocks each having a write time which is too long ago. Hence, some of these blocks may not reach a criterion of the garbage collection operation. For example, the number of valid pages for the block may be much greater than the threshold. In addition, since the data of the blocks recorded in the expired block table is about to deteriorate very soon, the priority of the expired block table is higher than that of the garbage collection sequence. That is, if there is any block number recorded in the expired block table, the flash memory controller 110 stops the garbage collection operation and starts to perform the expired block collection operation under a condition that the garbage collection operation is allowed to be interrupted. In other words, the flash memory controller 110 will immediately perform the expired block recycling operation on the blocks recorded in the expired block table.

In step 714, since blocks are written and erased during the expired block recycling operation in step 712, the microprocessor 112 updates the write time table 500 according to the above-mentioned writing and erasing of the blocks. For example, if the block B1 is marked as invalid or erased, the microprocessor 112 can delete the time information about the block B1 in the write time table 500.

In the above steps 708 and 710, the reason why blocks are added to the expired block table according to the second threshold is that the time information of the intermediate page can better show the overall write time of the block. Furthermore, through the second threshold being set later than the first threshold and the blocks with the time information of the intermediate page between the second threshold and the first threshold being added to the expired block table, the proposed flow can add a sufficient number of blocks to the expired block table at one time for the subsequent expired block recycling operation, without repeating the process in FIG. 7 or other mechanisms frequently to select blocks required to undergo the expired block recycling operation. In addition, the data stored in blocks of the 3D flash memory will deteriorate rapidly as time elapses. However, when a block has been read or written (by writing data to the remaining page), the overall data quality of the block can be slightly improved. Therefore, using the above-mentioned second threshold and first threshold as the determining mechanism may allow the blocks with poorer quality to be added to the expired block table first. In addition, the data write time between different pages in the block may be very different, that is, the time information of the first page of the block and the time information of the intermediate page may be very different. Therefore, through further using the time information of the intermediate page that can better show the overall write time of the block, the determination of expired blocks can be more accurate.

Referring to the embodiment in FIGS. 3-7 above, the write time table 500 is created to record the time information of the first page and intermediate page of each block, and the first threshold and the second threshold are used to select blocks that require undergoing the expired block recycling operation. Overall, it is faster and more efficient to select the blocks that require undergoing the expired block recycling operation.

The expired block recycling operation requires cooperating with a link table of logical pages and physical pages, to find all valid pages in the block and to move the valid pages from the expired block to a new block. Since the data move operation causes the data in the valid page to be rewritten to the new block, the validity period of these data is reset, and the expired block is erased for use. After moving the valid data, the microprocessor 112 requires updating the link table of logical pages and physical pages, and creates a data number table of valid pages of the new block. To be cautious, the invalid data in the expired block can also be moved to another new block, and a link table of logical pages and physical pages can be created for the invalid data accordingly, thereby allowing data recovery when the host device deletes the data by mistake. It should be noticed that, in some expired blocks, all pages may be valid pages, and all the data have to be moved to the new block and the validity period of all the data has to be reset.

In addition, in some applications, the flash memory module 120 has thousands of blocks being frequently written. Therefore, the write time table 500 requires recording many block numbers and related time information. The storage space of the DRAM 140 is seriously consumed. In addition, if the memory device 100 does not have a DRAM 140 and the write time table 500 requires being stored in the buffer memory 116, the buffer memory 116 may cause more trouble in the arrangement of memory configuration due to the fact that the buffer memory 116 is usually implemented by using an SRAM that is more expensive and does not have a large storage space. Therefore, a compression method of the write time table 500 is presented in the following embodiment, which can write most content of the write time table 500 to the block of the flash memory module 120, in order to reduce the size of the write time table 500 stored in the DRAM 140 or the buffer memory 116.

Figure 8:
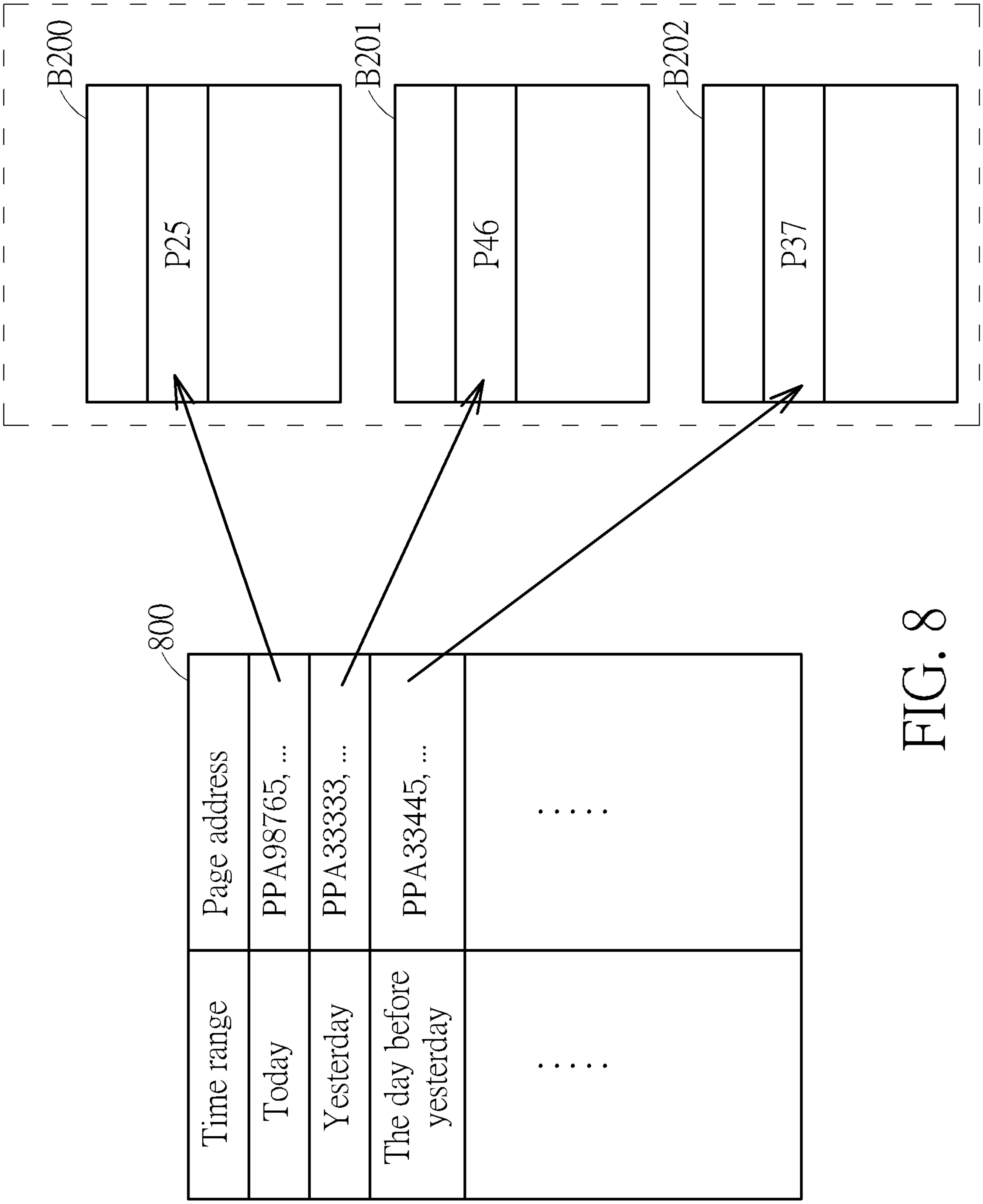
FIG. 8 is a diagram illustrating a compressed write time table.

For example, referring to FIG. 8 that is a diagram illustrating a compressed write time table 800, the compressed write time table 800 can be derived from simplifying/compressing the write time table 500. In FIG. 8, the compressed write time table 800 includes multiple time ranges and corresponding at least one page address, wherein the multiple time ranges can be any suitable time ranges, and the time ranges in this embodiment are expressed in the units of day. In the embodiment shown in FIG. 8, the microprocessor 112 sequentially or periodically writes the block numbers and the corresponding time information of the write time table 500 into the blocks of the flash memory module 120. Taking a situation of the time range "today" in FIG. 8 as an example for illustration, when the flash memory controller 110 writes data to multiple blocks of the flash memory module 120 and synchronously creates the write time table 500, the microprocessor 112 writes the block numbers and the corresponding time information recorded in the write time table 500 to a page P25 of a block B200, and the compressed write time table 800 records the page address "PPA98765" of the page P25 of the block B200. In addition, since the page P25 of the block B200 records a content of the write time table 500, the microprocessor 112 may delete the relevant data in the write time table 500 to release the storage space. In the same way, the page address "PPA33333" recorded for the time range "yesterday" shown in FIG. 8 corresponds to the page P46 of the block B201, and the page P46 of the block B201 records the block numbers of the blocks written yesterday and the corresponding time information. In the same way, the page address "PPA33445" recorded for the time range "the day before yesterday" shown in FIG. 8 corresponds to the page P37 of the block B202, and the page P37 of the block B202 records the block numbers of blocks written in the day before yesterday and the corresponding time information. Therefore, since the content of the write time table 500 shown in FIG. 5 can be stored in the flash memory module 120 and the compressed write time table 800 only needs to record some page addresses in the flash memory module 120, the storage burden of the write time table 500 can be effectively reduced.

In addition, since the blocks in the flash memory module 120 may be erased and become blank blocks, when the microprocessor 112 knows that a block has been erased, it will update the flash memory module 120 and the content of the compressed write time table 800. For example, assuming that the block B1 written yesterday is erased today, the microprocessor 112 reads the content of the page P46 of the block B201, deletes the block number of the block B1 and the related time information, and rewrites the updated content to another page, such as the page P47 of the block B201; and further replaces the page address of page P46 of the block B201 that is originally recorded in the compressed write time table 800 with the page address of the page P47 of the block B201.

In addition, in order to facilitate the management of blocks and pages, each time range in the compressed write time table 800 corresponds to a dedicated block. For example, the block numbers and the related time information of all blocks written the day before yesterday are written to block B202, and the block numbers and the related time information of all blocks written yesterday are written to block B201, the block numbers and the related time information of all blocks written today are written to block B200, and so on. In addition, the above-mentioned dedicated blocks are not used to store other data.

To briefly summarize the present invention, in the control method of the present invention applied to a flash memory controller, the time information of the first page and the intermediate page of each block is recorded by creating the write time table, and select blocks requires being performed the expired block recycling operation by using the first threshold and the second threshold, so as to efficiently complete the expired block recycling operation. In addition, through compressing the write time table, the burden of storage space of the write time table can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method applied to a flash memory controller, wherein the flash memory controller is configured to access a flash memory module, the flash memory module is a three-dimensional (3D) NAND-type flash module, the flash memory module comprises a plurality of flash memory chips, each flash memory chip comprises a plurality of blocks, each block comprises a plurality of pages; each block comprises a plurality of floating gate transistors controlled by multiple word lines and multiple bit lines which are located on different planes, the floating gate transistors on each word line form at least one page of the plurality of pages; the control method comprising:

in response to data being written to a first page of any block of the flash memory module, recording a first time into the first page;

in response to data being written to at least one intermediate page of the block of the flash memory module, recording a second time into said at least one intermediate page;

in response to data being written to a last page of the block of the flash memory module, recording the first time and the second time into the last page;

creating a write time table, wherein the write time table records block numbers of blocks having the data stored therein and the corresponding first time, or records block numbers of blocks having the data stored therein and the corresponding first time and second time;

referring to the write time table to determine there is at least one first block in the flash memory module that has the first time earlier than a first threshold, and in response to the flash memory module having the at least one first block with the first time earlier than the first threshold, recording said at least one first block into an expired block table;

referring to the write time table to determine there is at least one second block in the flash memory module that has the second time earlier than a second threshold, and in response to the flash memory module having the at least one second block with the second time earlier than the second threshold, recording said at least one second block into the expired block table; and in response to said at least one first block and said at least one second block being recorded in the expired block table, performing an expired block recycling operation to move a valid data in said at least one first block and said at least one second block to at least one blank block in sequence.

2. The control method of claim 1, wherein a time represented by the second threshold is later than a time represented by the first threshold.

3. The control method of claim 1, wherein the first threshold is determined according to a current time in response to the control method being executed.

4. The control method of claim 1, wherein said at least one intermediate page comprises a plurality of intermediate pages, and the second time recorded into the write time table is determined according to a plurality of write time of the plurality of intermediate pages.

5. The control method of claim 1, wherein referring to the write time table to determine there is at least one second block in the flash memory module that has the second time earlier than the second threshold, and in response to the flash memory module having said at least one second block with the second time earlier than the second threshold, recording said at least one second block into the expired block table comprise:

determining a number of blocks recorded into the expired block table reaches an upper limit;

in response to the number of blocks recorded into the expired block table reaching the upper limit, not recording said at least one second block into the expired block table;

in response to the number of blocks recorded into the expired block table not reaching the upper limit, recording said at least one second block into the expired block table until the number of blocks recorded into the expired block table reaches the upper limit; and wherein according to said at least one first block and said at least one second block recorded in the expired block table, performing the expired block recycling operation comprises:

in a background operation of the flash memory controller, immediately performing the expired block recycling operation according to said at least one first block and said at least one second block recorded into the expired block table.

6. The control method of claim 1, further comprising:

writing the write time table to a specific block of the flash memory module;

in response to the flash memory controller being powered on, determining the flash memory controller encountered an abnormal power-off before being powered on;

in response to the flash memory controller not encountering the abnormal power-off before being powered on, reading the write time table from the specific block, and temporarily storing the write time table in a buffer memory or a dynamic random access memory (DRAM); and in response to the flash memory controller encountering the abnormal power-off before being powered on, reading the last page of each block with data written therein in the flash memory module in sequence, to re-create the write time table, and temporarily storing the write time table in the buffer memory or the DRAM.

7. The control method of claim 6, wherein in response to the flash memory controller encountering the abnormal power-off before being powered on, reading the last page of each block with data written therein in the flash memory module in sequence, to re-create the write time table comprises:

in response to the last page of any block included in said each block with data written in the flash memory module not comprising the first time and the second time, reading the first page and the intermediate page of said any block, to obtain the corresponding first time and the corresponding second time.

8. The control method of claim 6, wherein an operation of re-creating the write time table is completed within an elapsed time of an initialization operation after the flash memory controller is powered on.

9. A flash memory controller configured to access a flash memory module, the flash memory module is a three-dimensional (3D) NAND-type flash module, the flash memory module comprises a plurality of flash memory chips, each flash memory chip comprises a plurality of blocks, each block comprises a plurality of pages; each block comprises a plurality of floating gate transistors controlled by multiple word lines and multiple bit lines which are located on different planes, the floating gate transistors on each word line form at least one page of the plurality of pages; the flash memory controller comprising:

a read only memory, configured to store a code;

a microprocessor, configured to execute the code for controlling access of the flash memory module; and a buffer memory;

wherein when the microprocessor writes data to a first page of any block of the flash memory module, a first time is recorded into the first page; when the microprocessor writes data to at least one intermediate page of the block of the flash memory module, a second time is recorded into said at least one intermediate page; when the microprocessor writes data to a last page of the block of the flash memory module, the first time and the second time are recorded into the last page; the microprocessor further creates a write time table, wherein the write time table records block numbers of blocks having the data stored therein and the corresponding first time, or records block numbers of blocks having the data stored therein and the corresponding first time and second time;

wherein the microprocessor refers to the write time table to determine whether there is at least one first block in the flash memory module that has the first time earlier than a first threshold, and if the flash memory module has the at least one first block with the first time earlier than a first threshold, said at least one first block is recorded into an expired block table; the microprocessor refers to the write time table to determine whether there is at least one second block in the flash memory module that has the second time earlier than a second threshold, and if the flash memory module has the at least one second block with the second time earlier than a second threshold, said at least one second block is recorded into the expired block table; and the microprocessor performs an expired block recycling operation in response to said at least one first block and said at least one second block being recorded in the expired block table, to move a valid data in said at least one first block and said at least one second block to at least one blank block in sequence.

10. The flash memory controller of claim 9, wherein a time represented by the second threshold is later than a time represented by the first threshold.

11. The flash memory controller of claim 9, wherein the first threshold is determined according to a current time when the code is executed for controlling access of the flash memory module.

12. The flash memory controller of claim 9, wherein said at least one intermediate page comprises a plurality of intermediate pages, and the second time recorded into the write time table is determined according to a plurality of write time of the plurality of intermediate pages.

13. The flash memory controller of claim 9, wherein the microprocessor determines whether a number of blocks recorded into the expired block table reaches an upper limit; if the number of blocks recorded into the expired block table reaches the upper limit, said at least one second block is not recorded into the expired block table; if the number of blocks recorded in the expired block table does not reach the upper limit, the microprocessor records said at least one second block into the expired block table until the number of blocks recorded in the expired block table reaches the upper limit; and in a background operation of the flash memory controller, the microprocessor immediately performs the expired block recycling operation according to said at least one first block and said at least one second block recorded in the expired block table.

14. The flash memory controller of claim 9, wherein the microprocessor writes the write time table to a specific block of the flash memory module; when the flash memory controller is powered on, the microprocessor determines whether the flash memory controller encountered an abnormal power-off before being powered on; if the flash memory controller did not encounter the abnormal power-off before being powered on, the microprocessor reads the write time table from the specific block, and temporarily stores the write time table in the buffer memory or a dynamic random access memory (DRAM); and if the flash memory controller encounters the abnormal power-off before being powered on, the microprocessor reads the last page of each block with data written therein in the flash memory module in sequence, to re-create the write time table, and the microprocessor temporarily stores the write time table in the buffer memory or the DRAM.

15. The flash memory controller of claim 14, wherein if the last page of any block included in said each block with data written therein in the flash memory module does not comprise the first time and the second time, the microprocessor reads the first page and said at least one intermediate page of said any block, to obtain the corresponding first time and the corresponding second time.

16. The flash memory controller of claim 14, wherein an operation of re-creating the write time table is completed within an elapsed time of an initialization operation after the flash memory controller is powered on.

17. A memory device, comprising:

a flash memory module, wherein the flash memory module is a three-dimensional (3D) NAND-type flash module, the flash memory module comprises a plurality of flash memory chips, each flash memory chip comprises a plurality of blocks, each block comprises a plurality of pages; each block comprises a plurality of floating gate transistors controlled by multiple word lines and multiple bit lines which are located on different planes, the floating gate transistors on each word line form at least one page of the plurality of pages; and a flash memory controller, configured to access the flash memory module;

wherein when the flash memory controller writes data to a first page of any block of the flash memory module, a first time is recorded into the first page; when the flash memory controller writes data to at least one intermediate page of the block of the flash memory module, a second time is recorded into said at least one intermediate page; when the flash memory controller writes data to a last page of the block of the flash memory module, the first time and the second time are recorded into the last page; the flash memory controller further creates a write time table, wherein the write time table records block numbers of blocks having the data stored therein and the corresponding first time, or records block numbers of blocks having the data stored therein and the corresponding first time and second time;

wherein the flash memory controller refers to the write time table to determine whether there is at least one first block in the flash memory module that has the first time earlier than a first threshold, and if the flash memory module has the at least one first block with the first time earlier than a first threshold, said at least one first block is recorded into an expired block table; the flash memory controller refers to the write time table to determine whether there is at least one second block in the flash memory module that has the second time earlier than a second threshold, and if the flash memory module has the at least one second block with the second time earlier than a second threshold, said at least one second block is recorded into the expired block table; and the flash memory controller performs an expired block recycling operation in response to said at least one first block and said at least one second block being recorded in the expired block table, to move a valid data in said at least one first block and said at least one second block to at least one blank block in sequence.

18. The memory device of claim 17, wherein a time represented by the second threshold is later than a time represented by the first threshold.

19. The memory device of claim 17, wherein the first threshold is determined according to a current time when the flash memory controller controls access of the flash memory.

20. The memory device of claim 17, wherein said at least one intermediate page comprises a plurality of intermediate pages, and the second time recorded into the write time table is determined according to a plurality of write time of the plurality of intermediate pages.

* * * * *